United States Patent [19]
He

[11] Patent Number: 6,027,973
[45] Date of Patent: Feb. 22, 2000

[54] OXIDATION AND ETCHBACK PROCESS FOR FORMING THICK CONTACT AREA ON POLYSILICON LAYER IN MICROELECTRONIC STRUCTURE

[75] Inventor: Yue-Song He, San Jose, Calif.

[73] Assignee: Advanced Micro Devices, Sunnyvale, Calif.

[21] Appl. No.: 08/987,526

[22] Filed: Dec. 9, 1997

[51] Int. Cl.$^7$ .............................................. H01L 21/8247
[52] U.S. Cl. ........................................... 438/258; 438/586
[58] Field of Search .................................. 438/258, 264, 438/265, 453, 587, 586, 634, 637, 674, 675

[56] References Cited

U.S. PATENT DOCUMENTS

| | | | |
|---|---|---|---|
| 4,541,893 | 9/1985 | Knight | 438/634 |
| 5,053,349 | 10/1991 | Matsuoka | 438/586 |
| 5,472,892 | 12/1995 | Gwen et al. | 438/258 |
| 5,476,814 | 12/1995 | Ohshima et al. | 438/637 |

OTHER PUBLICATIONS

Wolf, "Silicon Processing for the VLSI Era", vol. 1, Process Technology, pp. 182–183, 198–199, 518, 529–534, 539–541, 581–582, 1986.

*Primary Examiner*—Chandra Chaudhari
*Attorney, Agent, or Firm*—David G. Alexander; Arter & Hadden LLP

[57] ABSTRACT

A NAND type flash Electrically Erasable Programmable Read-Only Memory (Flash EEPROM) includes an array of memory cells which each include a floating gate for storing charge when the cell is programmed. Select lines are used to control programming, reading and erasing of the cells. The floating gates and the select line are integrally formed from a first polysilicon layer (POLY 1). A contact area of the select line which is used to make external connection through a vertical interconnect (via) is made thicker than the floating gates to avoid punchthrough of the contact area during a dry etching step which is used to form the via. The POLY 1 layer is first formed to an initial thickness, and a silicon nitride mask layer is formed over the POLY 1 layer. The portion of the silicon nitride layer over the contact area is protected with photoresist, and the remaining area of the silicon nitride layer is etched away. A predetermined surface thickness of the POLY 1 layer is oxidized to form silicon dioxide, and the silicon dioxide is etched away using an etchant which has a low, preferably zero etch rate for polysilicon, such that the thickness of the polysilicon layer except in the contact area which is protected by the silicon nitride mask layer is reduced. The thinned polysilicon layer is then patterned to form the select lines and the floating gates.

23 Claims, 7 Drawing Sheets

OXIDATION AND ETCHBACK PROCESS FOR FORMING THICK CONTACT AREA ON POLYSILICON LAYER IN MICROELECTRONIC STRUCTURE

BACKGROUND OF THE INVENTION

1. Field of the Invention

The present invention generally relates to the art of microelectronic integrated circuits, and more specifically to an oxidation and etchback process for forming a thick contact area on a polysilicon layer in a semiconductor structure.

2. Description of the Related Art

A microelectronic flash or block erase Electrically Erasable Programmable Read-Only Memory (Flash EEPROM) includes an array of cells which can be independently programmed and read. The size of each cell and thereby the memory are made small by omitting select transistors which would enable the cells to be erased independently. All of the cells are erased together as a block.

A memory of this type includes individual Metal-Oxide-Semiconductor (MOS) memory cells, each of which includes a source, drain, floating gate and control gate to which various voltages are applied to program the cell with a binary 1 or 0, or erase all of the cells as a block.

Figure 1:
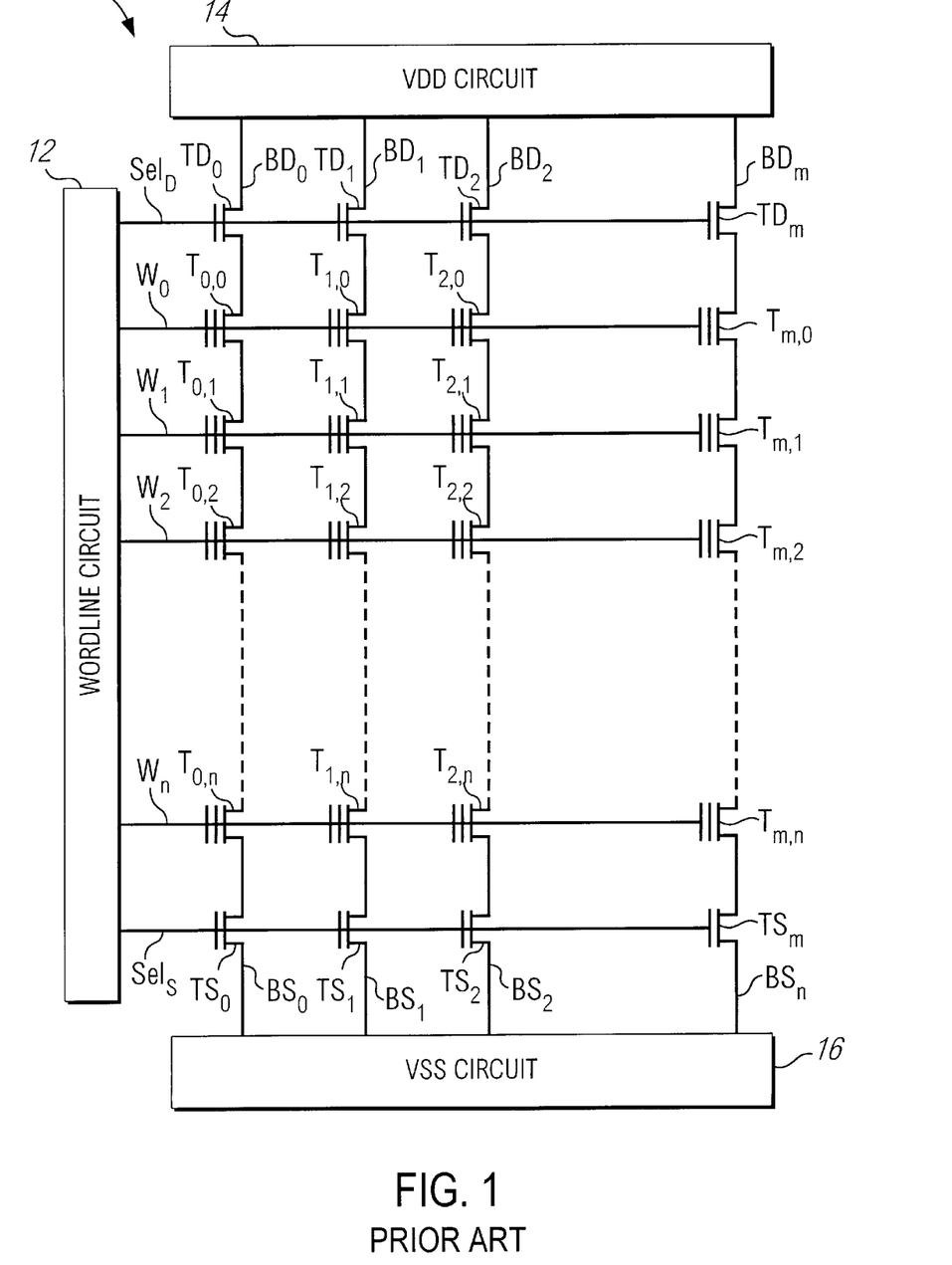
FIG. 1 is a diagram illustrating a NAND type Electrically Erasable Programmable Read-Only Memory (Flash EEPROM) to which the present invention is advantageously applicable.

A type of flash EEPROM memory to which the present invention is especially applicable has a NAND architecture and is designated by the reference numeral 10 in FIG. 1. A NAND flash EEPROM has certain advantages over more conventional NOR type EEPROMs, in which the memory cells are connected to bitlines in a parallel manner. In a NAND EEPROM, the cell size is reduced by connecting the cells in series between bit lines and source lines, thereby eliminating contacts to the individual cells. A NAND EEPROM typically occupies approximately 85% of the area of a NOR EEPROM. Another advantage of a NAND EEPROM is lack of disturb conditions which result in programming or erasure of unselected cells during programming or erasure of selected cells.

The memory 10 includes a plurality of wordlines $W_0$ to $W_n$ which are connected to a wordline circuit 12 and are used to select rows of cells in the memory 10. Drain bitlines $BD_0$ to $BD_m$ which are connected to a drain or $V_{DD}$ circuit 14 and source bitlines $BS_0$ to $BS_m$ which are connected to a source or $V_{SS}$ circuit 16 are used in combination to select columns of cells in the memory 10. A drain select line $Sel_D$ and a source select line $Sel_S$ are also connected to the wordline circuit 12.

A plurality of Metal-Oxide-Semiconductor transistors which constitute select cells and memory cells are connected to the wordlines, bitlines and select lines. More specifically, the drains of drain select transistors $TD_0$ to $TD_m$ are connected to the drain bitlines $BD_0$ to $BD_m$ respectively, with the gates of the transistors $TD_0$ to $TD_m$ all being connected to the drain select line SelD. Similarly, the sources of source select transistors $TS_0$ to $TS_m$ are connected to the source bitlines $BS_0$ to $BS_m$ respectively, with the gates of the transistors $TS_0$ to $TS_m$ all being connected to the source select line SelS.

Memory cell transistors $T_{0,0}$ to $T_{0,n}$ are connected in series between the source of the drain select transistor $TD_0$ and the drain of the source select transistor $TS_0$. Control gates of the transistors $T_{0,0}$ to $T_{m,0}$ are connected to the wordline $W_0$. Memory cell transistors $T_{1,0}$ to $T_{m,n}$ are similarly connected between the drain bitlines $BD_1$ to $BD_m$ and source bitlines $BD_1$ to $BD_m$ and to the wordlines $W_1$ to $W_n$ to form an array of n x m memory cells. The memory cell transistors differ from the select transistors in that they additionally include a floating gate between their control gates and channels.

The memory cell transistors are typically formed in a p-well of an n-type semiconductor substrate which is not shown. The drain select gates $TD_0$ to $TD_m$ are provided to ensure cell selectivity, whereas the source select gates $TS_0$ to $TS_m$ are turned off during programming to prevent current flow through the cells.

The cells are erased by controlling the wordline circuit 12, drain circuit 14 and source circuit 16 to ground the control gates, apply a voltage on the order of +20 v to the n-substrate and p-well, and allow the bitlines to float. Electrons are caused to flow from the floating gates to the p-well by Fowler-Nordheim tunneling. The floating gates attain a positive charge, and the threshold voltages of the erased cells become negative. The erased cells function as depletion mode transistors.

An individual memory cell is programmed to a logical "1" state by applying typically +20 v to its control gate through its wordline and typically +7 v to the wordlines of the unselected cells. The p-well is grounded. The selected drain bitline is grounded and +7 v is applied to the unselected drain bitlines. The unselected transistors in the selected bitline are turned on and act as pass gates for the selected transistor. Electrons are injected from the p-well to the floating gate of the selected transistor by Fowler-Nordheim tunneling to cause the floating gate to attain a negative charge and a positive threshold voltage. The programmed cells function as enhancement mode transistors.

A cell is read by applying 0 v to its control gate and +5 v to the control gates of the unselected transistors in the selected bitline. The unselected transistors are turned on and act as pass gates for the selected transistor. The cell is read by a sense amplifier (not shown) which is connected to the bitlines. If the cell is not programmed (logical "0"), it will be in depletion mode and current will flow therethrough to the sense amplifier because the 0 v on the control gate will not overcome the negative threshold voltage and turn off the transistor. If the cell is programmed (logical "1"), it will be in enhancement mode and current will not flow therethrough to the sense amplifier because the 0 v on the control gate will not overcome the positive threshold voltage and turn on the transistor.

Figure 2:
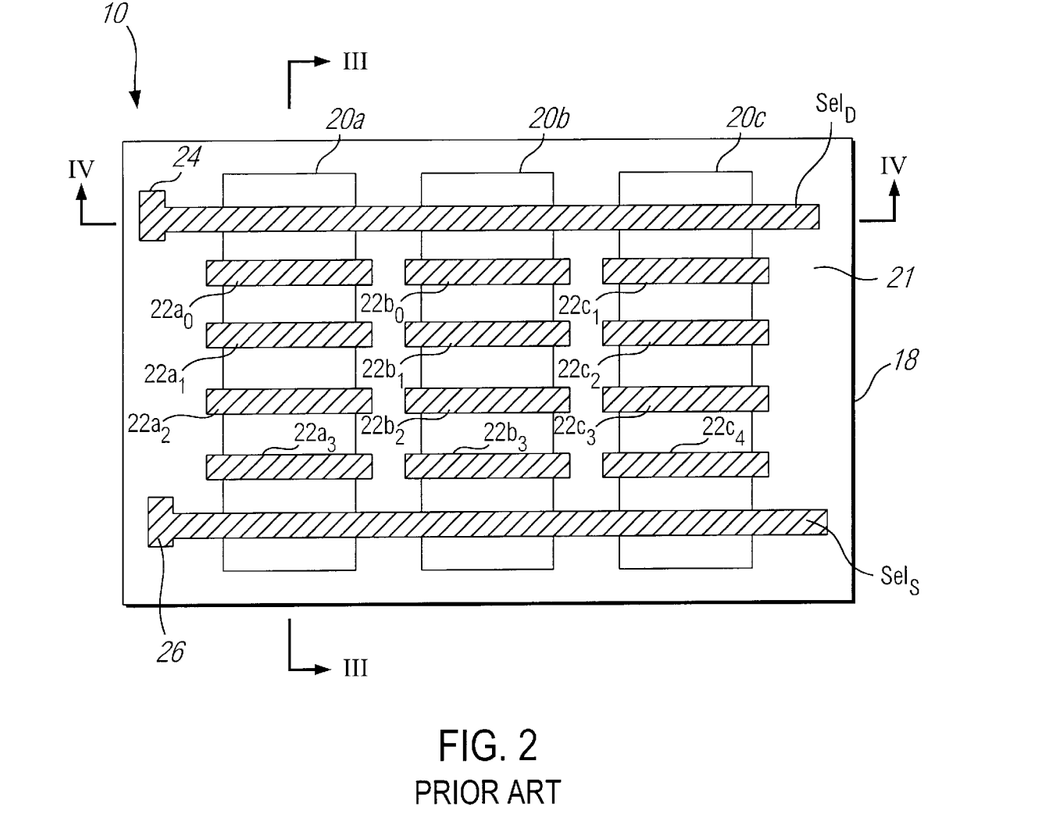
FIG. 2 is a simplified plan view illustrating the arrangement of a first polysilicon layer (POLY 1) of the memory.

FIG. 2 is a simplified view illustrating the overall arrangement of a first polysilicon layer (POLY 1) the memory 10. The memory 10 includes a semiconductor substrate 18, typically n-doped silicon, in which active core source/drain areas 20a, 20b and 20c which include p-wells are formed. In this simplified view, only three active areas are shown, whereas in the actual memory 10 there will be m active areas corresponding to the m bitlines. The active areas are separated from each other by electrically insulating core field oxide 21.

Floating gates $22a_0$ to $22a_3$ are formed over channel regions of memory cell transistors in the active area 20a. Floating gates $22b_0$ to $22c_4$ are similarly formed over channel regions in the active areas 20b and 20c. The drain select line $Sel_D$ and the source select line $Sel_S$ which were described above with reference to FIG. 1 are formed on the substrate 18 and cross the active areas 20a to 20c. The portions of the select lines $SEL_D$ and $SEL_S$ that overlie the active areas constitute the control gates of the corresponding select transistors $TD_0$ to $TD_m$ and $TS_0$ to $TS_m$ as described above.

The select lines and floating gates are integrally patterned from the POLY 1 layer. The select lines $Sel_D$ and $Sel_S$ have contact areas 24 and 26 which are used to provide external connection through vertical interconnects (vias) as will be described in detail below.

Figure 3:
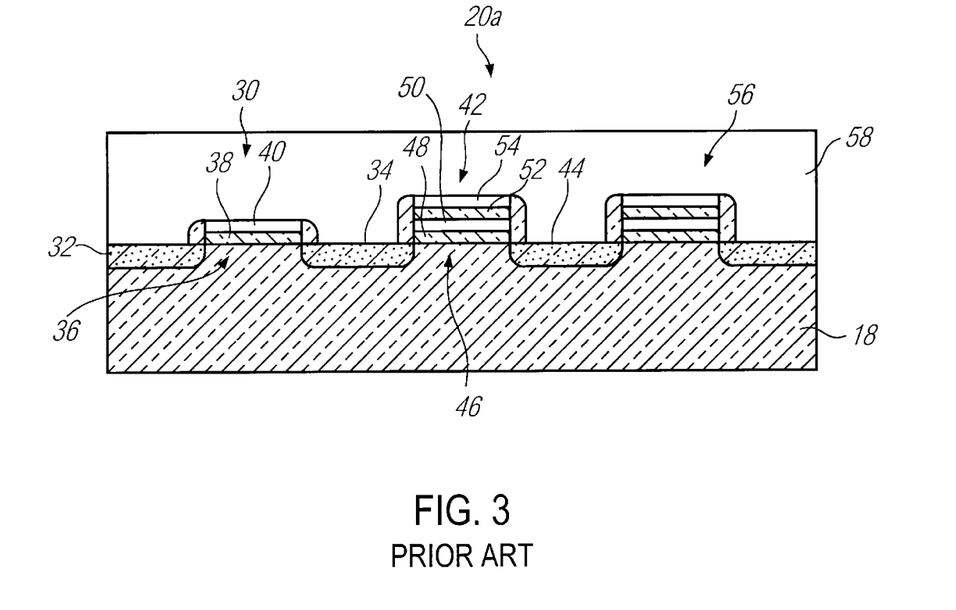
FIG. 3 is a section taken on a line III—III of FIG. 2.

FIG. 3 illustrates the structure of the select and memory cell transistors. This drawing illustrates a p-well of the substrate 18. A select transistor 30 includes an n-doped drain 32 and an n-doped source 34, with a portion of the p-well therebetween constituting a channel 36. A gate oxide layer 38 is formed over the channel 36, whereas a portion of the drain select line $Sel_D$ constitutes a gate 40 of the transistor 30.

A memory cell transistor 42 is laterally spaced from the select transistor 30, and includes a drain which is integral with the source 34 of the select transistor 30. The transistor 42 has a source 44 which is spaced from the drain 34 by a channel 46. A tunnel oxide layer 48 through which the above described Fowler-Nordheim tunneling occurs is formed over the channel 46.

A floating gate 50 which is part of the POLY 1 layer as described above is formed over the tunnel oxide layer 48. A gate oxide layer 52 is formed over the floating gate 50, whereas a control gate 54 is formed from a second polysilicon layer (POLY 2) over the gate oxide layer 52. The control gate 54 is connected to one of the wordlines although not illustrated in the drawing. A memory cell transistor 56 is connected in series with the transistor 42 in the arrangement described above with reference to FIG. 1. The entire structure is protectively encapsulated by an electrically insulating passivation layer 58 of, preferably, tetraethylorthosilicate (TEOS) glass.

Figure 4:
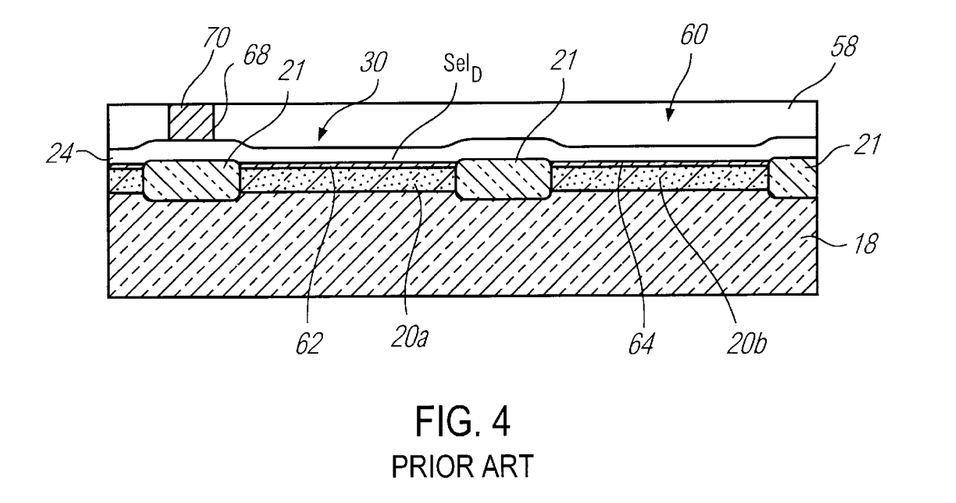
FIG. 4 is a section taken on a line IV—IV of FIG. 2.

The arrangement of the select line $Sel_D$ (the select line $Sel_S$ is essentially similar) is illustrated in FIG. 4, and includes the select transistor 30 as well as an adjacent select transistor 60. Gate oxide layers 62 and 64 are formed over channels of the select transistors 30 and 60 in the active areas 20a and 20b respectively, whereas portions of the POLY 1 layer SelD which overlie the gate oxide layers 62 and 64 constitute the gates of the transistors 30 and 60.

In order to provide external connection of the select line $Sel_D$ with other elements of the memory 10, a vertical interconnect hole or via 68 is etched down through the TEOS layer 58 to the contact area 24 of the POLY 1 layer. The via 68 is filled with tungsten metal or other electrically conductive material which forms an ohmic contact 70 with the contact area 24. Electrical connection of the select line $Sel_D$ to the wordline circuit 12 is made through the contact 70.

The via 68 is conventionally formed using reactive ion etching (RIE), which is an anisotropic dry etching process that forms clean vertical holes with high aspect ratios. A goal of the etching process is to stop the etching operation right on the top of the POLY 1 layer select line $SEL_D$. If the etching does not reach the POLY 1 layer, electrical contact to the POLY 1 layer cannot be made. Conversely, if the etching continues into or through the POLY 1 layer, highly undesirable results can occur.

Design rules for microelectronic circuits require that all parameters have a certain scale with relation to each other. Reduction of feature size to produce a smaller microelectronic device requires that all parameters be reduced together. Reduction in horizontal size requires a corresponding reduction in vertical size.

As microelectronic technology advances, the thickness of the POLY 1 layer is being progressively reduced from approximately 900 angstroms to 700 angstroms. Further reductions to the order of 400–500 angstroms are contemplated in the near future. With the POLY 1 layer is being made progressively thinner, it becomes progressively more difficult to stop via etching right on the top of the POLY 1 layer.

Figure 5:
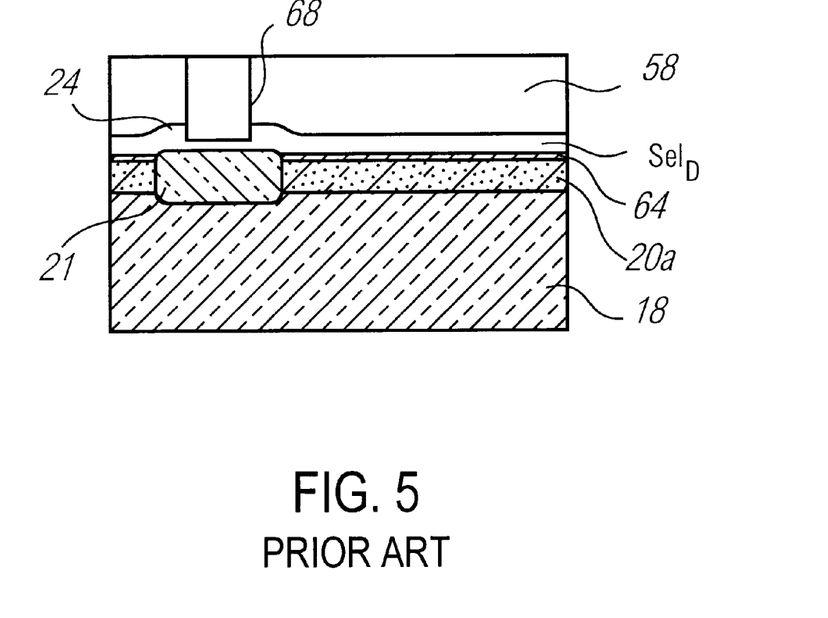
FIGS. 5 and 6 are enlarged sectional views illustrating a problem in the prior art.
Figure 6:
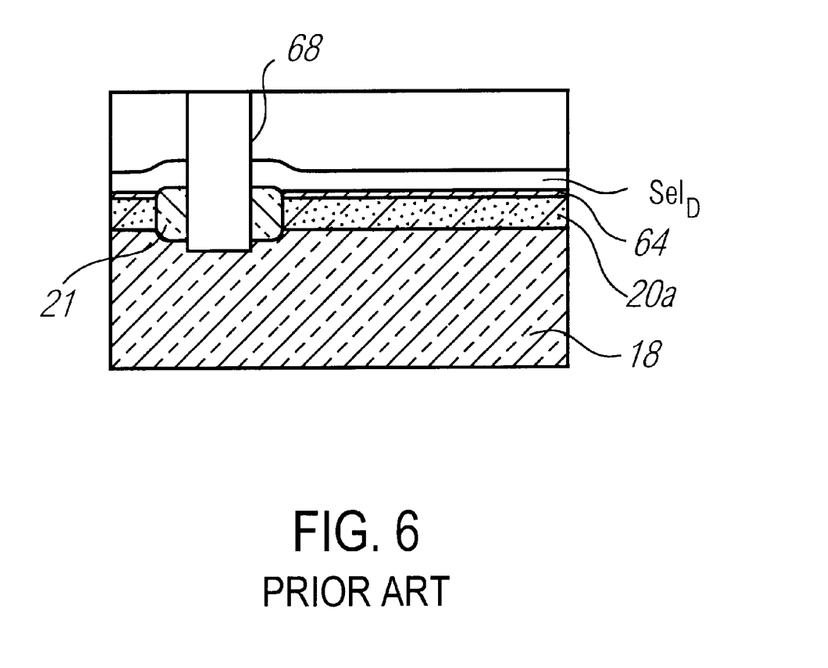

FIG. 5 illustrates a case in which etching proceeded longer than desired, and resulted in the via 68 cutting partially through the contact area 24. This results in an undesirable reduction in contact area between the metal in the via 68 and the POLY 1 layer, and thereby higher electrical resistance. FIG. 6 illustrates a case in which the via etching punched through the POLY 1 layer and also through the field oxide layer 21 into the substrate 18. This is a major problem since the contact 70 will be shorted to the substrate 18.

Such a condition can readily result because the field oxide layer 21 is only approximately 2,000 angstroms thick and the etchant which is used for RIE, typically $Cl_2$+HBr, etches silicon dioxide approximately 20 times faster than polysilicon. Thus, if the etching punches through the thin polysilicon layer POLY 1, it can quickly punch through the field oxide layer 21 into the substrate 18.

SUMMARY OF THE INVENTION

It is an object of the present invention to provide a process for forming a polysilicon layer in a microelectronic structure such that the main portion of the layer is relatively thin, and portions of the layer which are designed for external electrical contact are relatively thick. This enables the polysilicon layer to be made thin enough to conform with advanced design rules, and also obviate the prior art problem of etch punchthrough during via formation.

In accordance with the present invention, a NAND type flash Electrically Erasable Programmable Read-Only Memory (Flash EEPROM) includes an array of memory cells which each include a floating gate for storing charge when the cell is programmed. Select lines are used to control programming, reading and erasing of the cells. The floating gates and the select line are integrally formed from a first polysilicon layer (POLY 1). A contact area of the select line which is used to make external connection through a vertical interconnect (via) is made thicker than the floating gates to avoid punchthrough of the contact area during a dry etching step which is used to form the via.

The POLY 1 layer is first formed to an initial thickness, and a silicon nitride mask layer is formed over the POLY 1 layer. The portion of the silicon nitride layer over the contact area is protected with photoresist, and the remaining area of the silicon nitride layer is etched away. A predetermined surface thickness of the POLY 1 layer is oxidized to form silicon dioxide, and the silicon dioxide is etched away using an etchant which has a low, preferably zero etch rate for polysilicon, such that the thickness of the polysilicon layer except in the contact area which is protected by the silicon nitride mask layer is reduced. The thinned polysilicon layer is then patterned to form the select lines and the floating gates.

These and other features and advantages of the present invention will be apparent to those skilled in the art from the following detailed description, taken together with the accompanying drawings, in which like reference numerals refer to like parts.

DETAILED DESCRIPTION OF THE INVENTION

FIGS. 7a to 7g illustrate a process for fabricating a microelectronic structure in accordance with the present invention. A microelectronic structure which can be advantageously fabricated using the present method is a flash or block erase Electrically Erasable Programmable Read-Only Memory (Flash EEPROM). However, the invention is not limited to this or any other particular application, and can be used to fabricate any kind of suitable microelectronic structure.

Figure 7A:
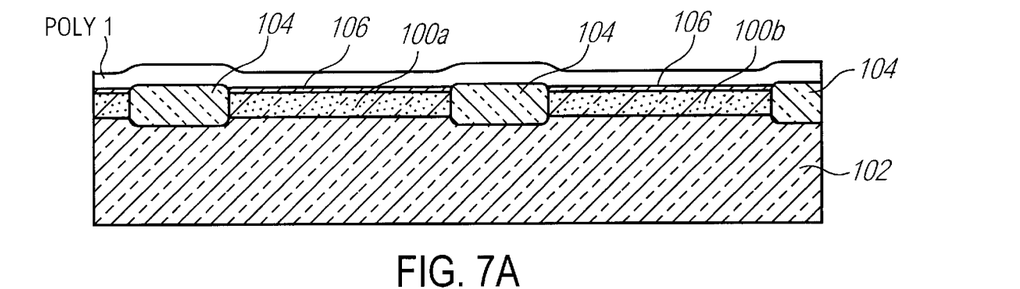
FIGS. 7a to 7g are sectional views illustrating a method of fabricating an EEPROM in accordance with the present invention.

FIG. 7a illustrates the initial steps of the process, in which active core source/drain regions 100a and 100b are formed in a semiconductor, preferably silicon, substrate 102. The active areas 100a and 100b are separated by core field oxide regions 104. Gate oxide layers 60 are formed over the active areas 100a and 100b to form partial select gate transistor structures. This arrangement is comparable to FIG. 4 as described above. The reference numerals designating these elements will be omitted from FIGS. 7b to 7g for clarity of illustration.

In the step of FIG. 7a, a relatively thick, preferably approximately 700 to 900 angstrom POLY 1 layer, is formed over the substrate 102 using chemical vapor deposition (CVD) or any other suitable process. For exemplary purposes it will be assumed that the thickness of the POLY 1 layer is 900 angstroms.

Figure 7B:
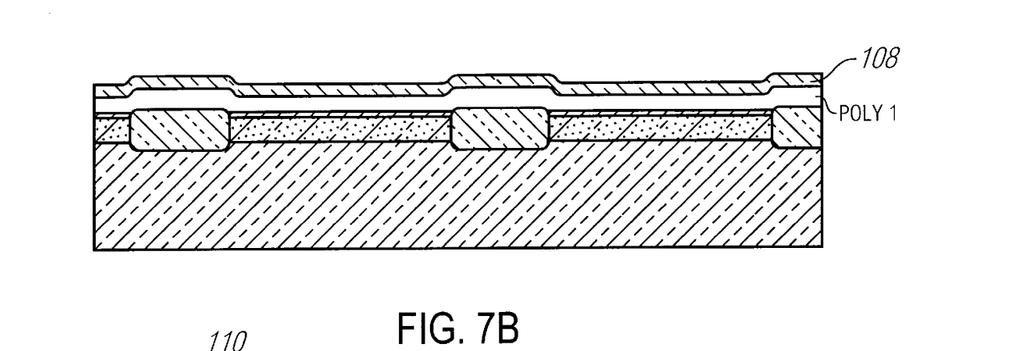

In FIG. 7b, a silicon nitride ($SI_3N_4$) protective mask layer 108 is formed over the POLY 1 layer. The thickness of this layer will be assumed to be on the order of 200 to 300 angstroms, although the thickness is not critical to practicing the invention.

Figure 7C:
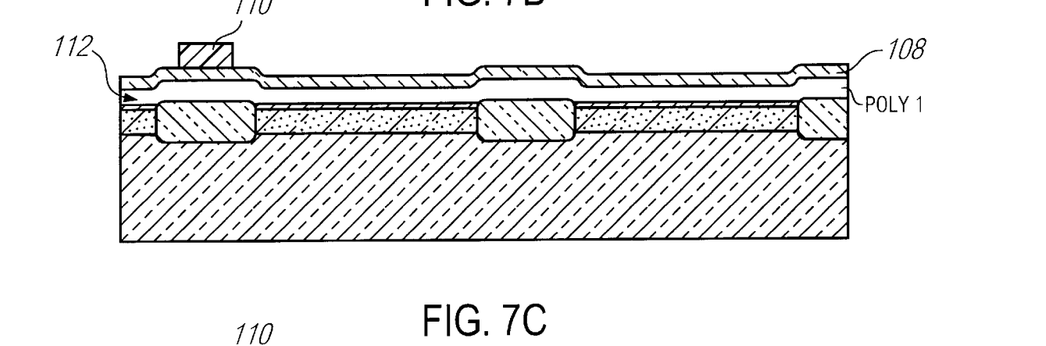

In FIG. 7c, a photoresist layer is formed over the silicon nitride layer 108 and patterned using conventional photolithographic techniques to form a photoresist mask 110. The mask 110 will typically be square or rectangular in shape and overlie a contact area 112 of the POLY 1 layer. As described above with reference to FIG. 4, the contact area 112 corresponds to an area of a select line of a NAND EEPROM that will be subsequently patterned from the POLY 1 layer and connected externally through a vertical interconnect (via).

Figure 7D:
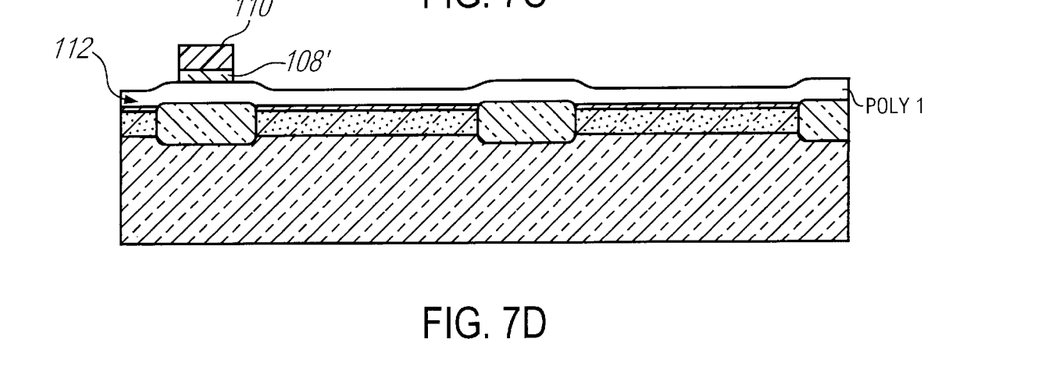

In FIG. 7d, the silicon nitride layer 108 is etched away except in the contact area 112 which is protected by the photoresist mask 110. Etching of the silicon nitride layer 108 is typically performed using dry reactive ion etching (RIE) with $CHF_3+O_2$ as the etchant. The result of this step is a protective silicon nitride mask over the contact area 112 which is redesignated as 108'.

Figure 7E:
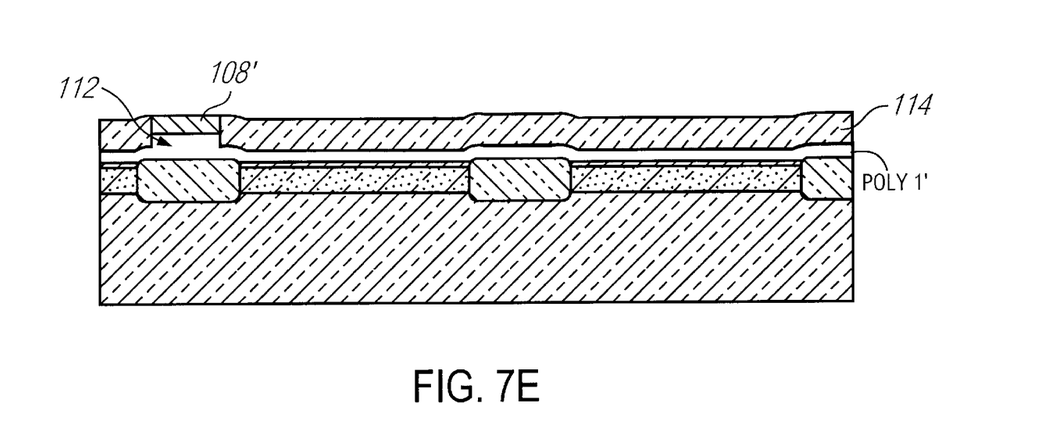

In FIG. 7e, the photoresist mask 110 is removed and a predetermined surface thickness of the POLY 1 layer is thermally oxidized such the original POLY 1 is converted to a structure including a silicon dioxide layer 114 overlying a thinned portion of the POLY 1 polysilicon layer which is redesignated as POLY 1'. As illustrated in the drawing, the contact area 112 of the POLY 1 layer is not oxidized or otherwise effected by the oxidation step because it is protected by the silicon nitride mask 108'.

Thus, the POLY 1' layer has its original thickness in the contact area 112, and is thinner in all other areas.

The surface thickness of the original POLY 1 layer which is to be oxidized in the step of FIG. 7e is predetermined such that the POLY 1' layer external of the contact area 112 will correspond to the final thickness desired, typically 400 to 500 angstroms. Assuming an exemplary value of 400 angstroms, 500 angstroms of the original POLY 1 layer will be oxidized to form the silicon dioxide layer 114. Since one part silicon and two parts oxygen are consumed to form silicon dioxide, the thickness of the silicon dioxide layer 114 will be 1,000 angstroms and the combined thickness of the POLY 1' and silicon dioxide layer 114 will be 1,400 angstroms. This relationship can be used to precisely control the oxidation process by monitoring the thickness of the structure.

Figure 7F:
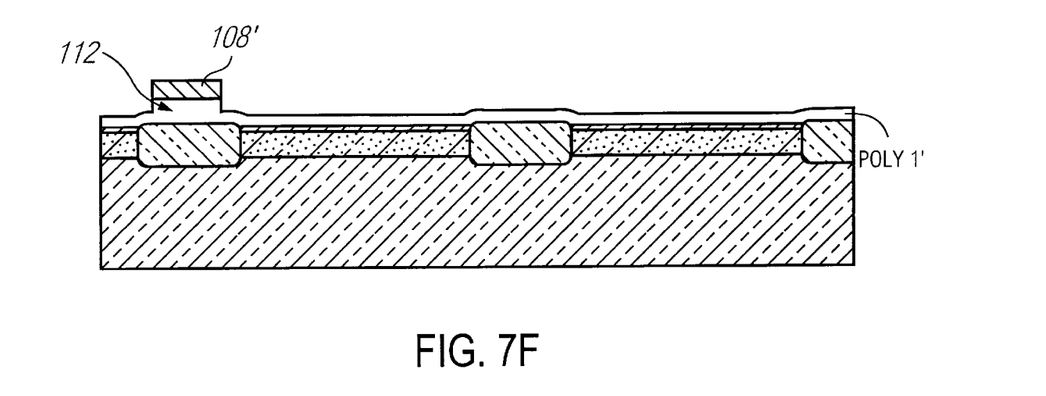
Figure 7G:
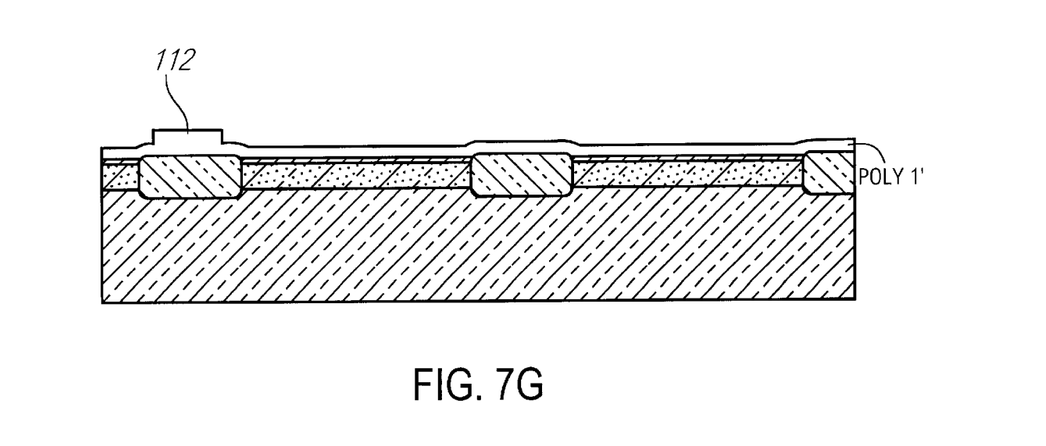

In the next step of FIG. 7f, the silicon dioxide layer 114 is etched away to leave only the 400 angstrom POLY 1' layer and the 900 angstrom contact area 112. This etching step is performed using an etchant with high selectively. More specifically, the etchant has a high etch rate for silicon dioxide and a low, preferably substantially zero etch rate for polysilicon. A preferred wet etchant for this step is hydrofluoric acid (HF). Alternatively the silicon dioxide layer can be removed by dry RIE using $CHF_3+He$ as the etchant. It will be understood that a number of suitable etchants are commercially available, and that the present invention can be practiced using any etchant that will perform the required function.

The silicon nitride protective mask 108' can be allowed to remain on the contact area 112 and be subsequently etched through along with the TEOS layer as described above with reference to FIG. 4 to form a vertical interconnect (via) which opens onto the contact area 112. Alternatively, the mask 108' can be removed using wet or dry etching as described above to form the structure illustrated in FIG. 7g.

Subsequent processing to form a NAND EEPROM is conventional and is not the particular subject matter of the present invention. The POLY 1' layer is photolithographically patterned to produce the structure as illustrated in FIG. 2 in which the POLY 1' layer is used to form the select lines in addition to the floating gates of the memory cell transistors.

Subsequent material layers are formed and patterned to form the structure illustrated in FIGS. 3 and 4.

In particular, vias are formed through the TEOS layer down to the thick contact areas 112 of the POLY 1' layer. The undesirable effects described above with reference to FIGS. 5 and 6 are prevented due to the increased thickness of the contact areas 112. As microelectronic circuit technology advances, the POLY 1' layer can be made as thin as possible without creating difficulty in etching contact vias because the contact areas can be made as thick as desired.

Figure 8A:
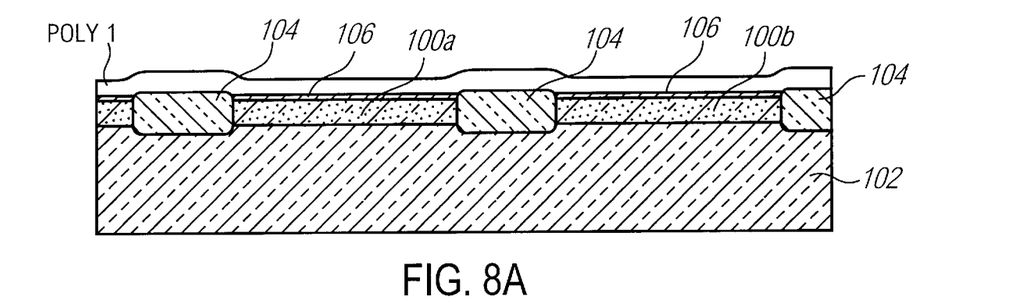
FIGS. 8a to 8d are sectional views illustrating another method according to the invention.
Figure 8B:
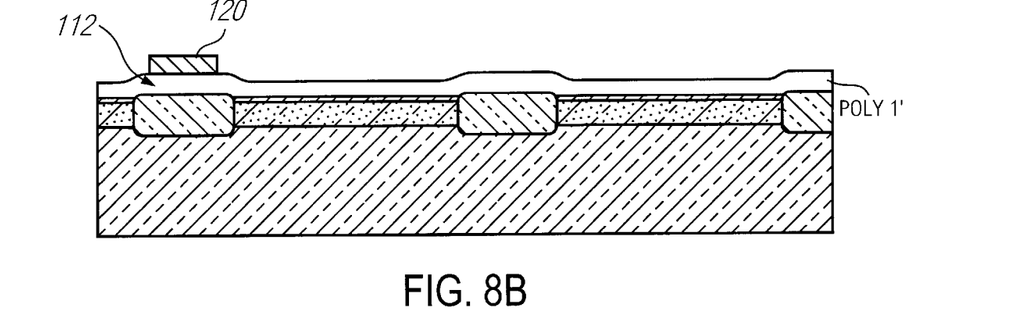

FIGS. 8a to 8d illustrate alternative processing which can be used separately or in combination with the method of FIGS. 7a to 7g. In FIG. 8a a thick polysilicon layer POLY 1 is formed in the manner described above with reference to FIG. 7a. In FIG. 8b, a protective mask 120 is formed over the contact area 112 of the POLY 1 layer. The mask 120 can be formed of silicon nitride, photoresist, or any other material that will protect the contact area 112 from being etched in a subsequent etching step.

Figure 8C:
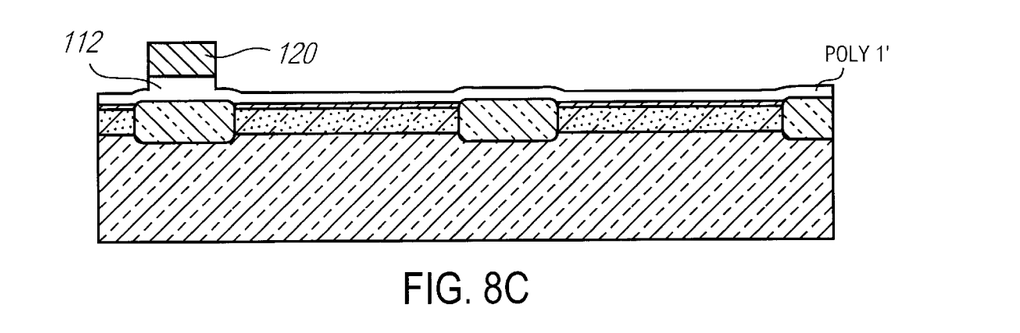
Figure 8D:
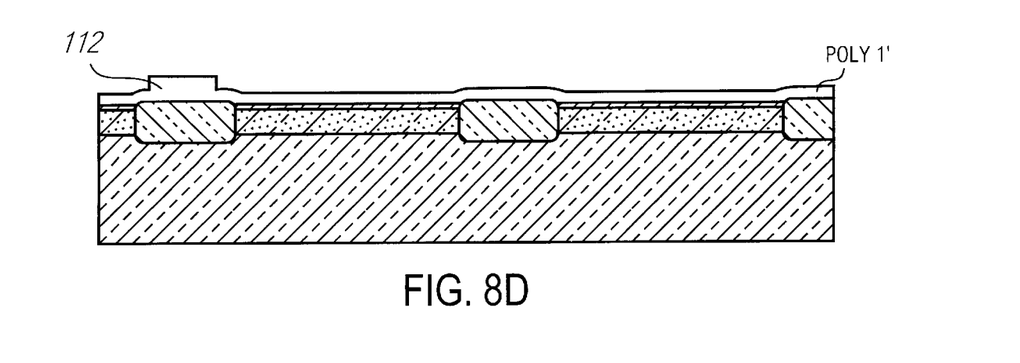

In FIG. 8c, a predetermined surface thickness of the POLY 1 is etched away, preferably using dry RIE with $Cl_2$+HBr as the etchant. Assuming that the original thickness of the POLY 1 layer is 900 angstroms, 500 angstroms will be etched away to provide the thinned POLY 1' layer with a thickness of 400 angstroms. In FIG. 8d the mask 120 is removed to provide a structure essentially similar to that illustrated in FIG. 7g.

The processing of FIGS. 7a to 7g and 8a to 8d can be combined to provide a composite method. For example, oxidation and etchback can be performed to remove a first surface thickness of the POLY 1 layer as illustrated in FIGS. 7a to 7f, and then the POLY 1' layer can be further thinned using dry etching to remove a second thickness. Alternatively, the sequence can be reversed, and an upper thickness of polysilicon removed using dry etching followed by oxidation and etchback of a second, lower thickness. Combining these two material removal methods can provide a desired combination of quality and control.

Various modifications will become possible for those skilled in the art after receiving the teachings of the present disclosure without departing from the scope thereof. For example, although the present method has been described for fabricating a NAND EEPROM having a two thickness POLY 1 layer, the invention is not so limited, and can be used to fabricate a microelectronic structure including any applicable type of material layer which is processed in accordance with the present method to have a thin main area and at least one thick contact area.

I claim:

1. A method for forming a thick contact area on a material layer of a microelectronic structure, comprising the steps of:
   (a) providing a substrate;
   (b) forming a material layer over the substrate;
   (c) forming a protective mask over a contact area of the material layer; and
   (d) etching away a predetermined surface thickness of the material layer except in the contact area which is protected from etching by the mask;
the method further comprising the step, performed between steps (c) and (d), of:
   (e) converting said surface thickness of the material layer to a material which has a higher etch rate in step (d) than prior to performing step (e).

2. A method as in claim 1, in which:
   step (b) comprises forming the material layer of polysilicon; and
   step (e) comprises oxidizing said surface thickness of the material layer.

3. A method as in claim 2, in which step (c) comprises the substeps of:
   (c1) forming a silicon nitride layer over the material layer; and
   (c2) etching away the silicon nitride layer except over the contact area.

4. A method as in claim 3, further comprising the step, performed after step (d), of:
   (f) removing the silicon nitride layer from over the contact area.

5. A method as in claim 3, in which step (c2) comprises the substeps of:
   (c3) forming a photoresist mask over the silicon nitride layer in the contact area;
   (c4) etching away the silicon nitride layer except in the contact area which is protected from etching by the photoresist mask; and
   (c5) removing the photoresist mask.

6. A method as in claim 2, in which step (d) comprises etching said surface thickness using an etchant which has a substantially zero etch rate for polysilicon.

7. A method as in claim 2, in which step (d) comprises wet etching using hydrofluoric acid.

8. A method as in claim 2, in which step (d) comprises dry etching using $CHF_3$.

9. A method as in claim 2, further comprising the step, performed after step (d), of:
   (f) etching away a predetermined second thickness of the material layer.

10. A method as in claim 9, in which step (f) comprises dry etching using $Cl_2$.

11. A method as in claim 1, in which:
    step (b) comprises forming the material layer of polysilicon; and
    step (d) comprises dry etching using $Cl_2$.

12. A method for fabricating a flash EEPROM memory, comprising the steps of:
    (a) providing a substrate;
    (b) forming a material layer over the substrate;
    (c) forming a protective mask over a contact area of a select line area on the material layer;
    (d) etching away a predetermined surface thickness of the material layer except in the contact area which is protected from etching by the mask; and
    (e) patterning the material layer to form said select line and a plurality of floating gates
the method further comprising the step, performed between steps (c) and (d), of:
    (f) converting said surface thickness of the material layer to a material which has a higher etch rate in step (d) than prior to performing step (d).

13. A method as in claim 12, in which:
    step (b) comprises forming the material layer of polysilicon; and
    step (f) comprises oxidizing said surface thickness of the material layer.

14. A method as in claim 13, in which step (c) comprises the substeps of:
    (c1) forming a silicon nitride layer over the material layer; and
    (c2) etching away the silicon nitride layer except over the contact area.

15. A method as in claim 14, further comprising the step, performed after step (d), of:
    (f) removing the silicon nitride layer from over the contact area.

16. A method as in claim 14, in which step (c2) comprises the substeps of:
    (c3) forming a photoresist mask over the silicon nitride layer in the contact area;
    (c4) etching away the silicon nitride layer except in the contact area which is protected from etching by the photoresist mask; and
    (c5) removing the photoresist mask.

17. A method as in claim 13, in which step (d) comprises etching said surface thickness using an etchant which has a substantially zero etch rate for polysilicon.

18. A method as in claim 13, in which step (d) comprises wet etching using hydrofluoric acid.

19. A method as in claim 13, in which step (d) comprises dry etching using $CHF_3$.

20. A method as in claim 13, further comprising the step, performed after step (d), of:
    (f) etching away a predetermined second thickness of the material layer.

21. A method as in claim 20, in which step (f) comprises dry etching using $Cl_2$.

22. A method as in claim 12, in which:
   step (b) comprises forming the material layer of polysilicon; and
   step (d) comprises dry etching using $Cl_2$.

23. A method as in claim 12, further comprising the step, performed between steps (a) and (b), of:
   (f) forming an oxide layer over the substrate in areas over which the floating gates are to be patterned in step (e).

* * * * *